United States Patent [19]
Burr et al.

[11] Patent Number: 5,719,422
[45] Date of Patent: Feb. 17, 1998

[54] LOW THRESHOLD VOLTAGE, HIGH PERFORMANCE JUNCTION TRANSISTOR

[75] Inventors: James B. Burr, Foster City; Michael P. Brassington, Sunnyvale, both of Calif.

[73] Assignee: Sun Microsystems, Inc., Palo Alto, Calif.

[21] Appl. No.: 831,659

[22] Filed: Apr. 9, 1997

Related U.S. Application Data

[60] Continuation of Ser. No. 535,926, Sep. 28, 1995, abandoned, which is a division of Ser. No. 414,621, Mar. 31, 1995, Pat. No. 5,622,880, which is a continuation-in-part of Ser. No. 292,513, Aug. 18, 1994.

[51] Int. Cl.$^6$ ................................ H01L 27/088
[52] U.S. Cl. .................... 257/336; 257/344; 257/345; 257/404; 257/408
[58] Field of Search ............................. 257/408, 336, 257/344, 900, 335, 345, 404

[56] References Cited

U.S. PATENT DOCUMENTS

| | | | |
|---|---|---|---|
| 4,017,888 | 4/1977 | Christie et al. | 257/404 X |
| 4,315,781 | 2/1982 | Henderson | 148/1.5 |
| 4,485,390 | 11/1984 | Jones et al. | 257/404 |
| 4,984,045 | 1/1991 | Matsunaga | 29/78 |
| 5,019,520 | 5/1991 | Komori | 437/26 |
| 5,060,033 | 10/1991 | Takeuchi | 357/23.4 |
| 5,075,242 | 12/1991 | Nakahara | 437/34 |
| 5,166,765 | 11/1992 | Lee et al. | 257/345 |
| 5,208,171 | 5/1993 | Ohmi | 437/34 |
| 5,243,210 | 9/1993 | Naruke | 257/320 X |
| 5,289,027 | 2/1994 | Terrill et al. | 257/327 |
| 5,338,697 | 8/1994 | Aoki et al. | 437/40 |
| 5,359,221 | 10/1994 | Miyamoto et al. | 257/408 |
| 5,374,839 | 12/1994 | Jeon et al. | 257/372 |
| 5,378,909 | 1/1995 | Chang et al. | 257/316 |

FOREIGN PATENT DOCUMENTS

| | | | |
|---|---|---|---|
| 0 697 740 A2 | 2/1996 | European Pat. Off. | |
| 59-81070 | 4/1984 | Japan | 257/345 |
| 62-295460 | 12/1987 | Japan | 257/345 |
| 63-300567 | 12/1988 | Japan | 257/345 |
| 002-1173 | 1/1990 | Japan | |
| 2001173 | 1/1990 | Japan | 257/345 |

OTHER PUBLICATIONS

Skotnicki, Tomasz, Merckel, Gerard, and Pedron, Thierry, "Anomalous Punchthrough in ULSI Buried–Channel Mosfet's", pp. 2548–2556, vol. 36, IEEE Translations on Electronic Devices, Nov. 1989.

Konaka, Masami, Iwai, Hiroshi, and Nishi, Yoshio, "Suppression of Anomalous Drain Current in Short Channel Mosfet", Japanese Journal of Applied Physics, Supplement 18–1, vol. 18, Tokyo Japan, 1979.

Nagai, Ryo, Umeda, Kazunori, Takeda, Eiji, "Low–Voltage High–Gain 0.2 μm N–Channel Metal Oxide Semiconductor Field Effect Transistors Channel Counter Doping with Arsenic", pp. 434–437, Japanese Journal of Applied Physics, vol. 32, No. 1B, Tokyo, Japan, Jan. 1993.

Patent Abstracts of Japan, vol. 012, No. 204, (E–620), Jun. 11, 1988, and JP-A-63 003448, (NEC Corp.) Jan. 8, 1988.

Patent Abstracts of Japan, vol. 011, No. 309, (E–547) Oct. 8, 1987, and JP-A-62 101068 (HITACHI LTD) May 11, 1987.

(List continued on next page.)

*Primary Examiner*—William Mintel
*Attorney, Agent, or Firm*—Hickman Beyer & Weaver, LLP

[57] ABSTRACT

Low threshold voltage MOS devices having buried electrodes are disclosed herein. Such devices have source and drain regions which include tip regions and plug regions. The buried electrodes have bottom boundaries located above the bottoms of the plug regions. The buried electrode has the same conductivity type as the device's bulk (albeit at a higher dopant concentration) and, of course, the opposite conductivity type as the device's source and drain. The exact dopant concentrations and locations of the buried electrodes should be provided such that punch through is avoided in MOS devices.

27 Claims, 8 Drawing Sheets

OTHER PUBLICATIONS

Patent Abstracts of Japan, vol. 008, No. 025, (E–225), Feb. 2, 1984, and JP-A-58 188160 (SANYO DENKI KK) Nov. 2, 1983.

Yan, R. H.; Lee, K. F.; Jeon, D.Y.; Kim, Y. O.; Park, B. G.; Pinto, M. R.; Rafferty, C. S.; Tennant, D. M.; Westerwick, E. H.; Chin, G. M.; Morris, M.D.; Early, K.; Mulgrew, P.; Mansfield, W. M.; Watts, R. K.; Voshchenkov, A. M.; Bokor, J.; Swartz, R. G.; and Ourmazd, A.; "High Performance 0.1–μm Room Temperature Si MOSFETs", Symposium on VLSI Technology Digest of Technical Papers, pp. 86–87, 1992.

Aoki, M.; Ishii, T.; Yoshimura, T.; Iiiyima, S., Yamanaka, T.; Kure, T.; Ohyu, K.; Shimohigashi, K.; "0.1 μm CMOS Devices Using Low–Impurity Channel Transistors (LICT)", pp. 9.8.1–9.8.3, IEDM, 1987.

Yoshimura, Hisao; Matsuoka, Fumitomo; and Masakaru, Kakumu "New CMOS Shallow Junction Well FET Structure (CMOS–SJET) for Low Power–Supply Voltage", Semiconductor Device Engineering Laboratory, Japan, Proceedings of IEDM (1992), pp. 909–912.

Burr, James B. and Peterson, Allen M.; "Energy Considerations in Multichip–Module Multiprocessors", *IEEE International Conference on Computer Design*, pp. 593–600, 1991.

Burr, J. and Peterson, A.; "Ultra Low Power CMOS Technology", *NASA VLSI Design Symposium*, pp. 4.2.1–4.2.13, 1991.

Burr, Jim; "Stanford Ultra Low Power CMOS", Symposium Record, Hot Chips . V, pp. 7.4.1–7.4.12, Stanford, CA, 1993.

"A New Lease on Life for Old–Fashioned Chips", Business Week, Science and Technology, p. 100, Dec. 20, 1993.

Burr, James B., and Scott, John, "A 200 mV Self–Testing Encoder/Decoder using Stanford Ultra–Low Power CMOS", IEEE International Solid–State Circuits Conference, 1994.

Okumura, Yoshinori; Shirahata, Masayoshi; Hachisuka, Atsushi; Okudaira, Tomonori; Arima, Hideaki; and Matsukawa, Takayuki; "Source–to–Drain Nonuniformly Doped Channel (NUDC) MOSFET Structures for High Current Drivability and Threshold Voltage Controllability", pp. 2541–2552, IEEE Transaction on Electron Devices, vol. 39, No. 11, Nov. 1992.

Sai–Halasz, George A.; Wordeman, Matthew R.; Kern, D.P.; Rishton, S.; and Ganin, E. "High Transconductance and Velocity Overshoot in NMOS Devices at the 0.1 μm Gate–Length Level", pp. 464–466, IEEE Electron Device Letters, vol. 9, No. 9, Sep. 1988.

LOW THRESHOLD VOLTAGE, HIGH PERFORMANCE JUNCTION TRANSISTOR

CROSS-REFERENCE TO RELATED APPLICATIONS

This is a continuation of application Ser. No. 08/535,926 filed Sep. 28, 1995, now abandoned which is a divisional of application Ser. No. 08/414,621 filed on Mar. 31, 1995, which later application is a continuation-in-part of U.S. patent application Ser. No. 08/292,513, filed Aug. 18, 1994, entitled LOW POWER, HIGH PERFORMANCE JUNCTION TRANSISTOR, and naming Burr and Brassington as inventors. This application is incorporated herein by reference in its entirety for all purposes.

BACKGROUND OF THE INVENTION

The present invention generally relates to high performance transistor devices, and more specifically to low threshold voltage, high performance MOS transistors having buried regions of increased dopant concentration located below the transistors' channel regions.

As MOS technology has evolved, the supply voltage (Vdd) has scaled with the size of the devices. For example, CMOS transistors having channel region widths in the range of 2 μm are provided with 5 volt supply voltages, whereas transistors having channel region widths in the range of 0.5 μm are provided with 3.3 volt supply voltages. As channel region widths decrease to 0.35 μm and 0.25 μm, the supply voltages correspondingly decrease to 2.5 and 1.8 volts. For many applications, it would be desirable to provide lower supply voltages for given device sizes. This is because devices requiring lower supply voltages generally conserve power, a feature which is especially desirable in systems which dissipate large amounts of energy or rely on limited power sources such as batteries. However, there has been some concern about the effect of low Vdd on device performance.

In circuits made up of conventional MOS devices, the relationship of maximum frequency $f_{max}$ to supply voltage and threshold voltage is governed by long and short channel effects of the component devices. As expected, for longer channel devices, the long channel effects predominate and for shorter channel devices, the short channel effects predominate. Most devices exhibit some characteristics of both, with devices having channel lengths between one and two micrometers exhibiting both characteristics about equally. The maximum frequency of circuits comprised of truly long channel devices is given by:

$$f_{max} \propto (V_{dd}-V_t)^2/V_{dd}$$

The same parameter for circuits made up of truly short channel devices is given by:

$$f_{max} \propto (V_{dd}-V_t)/V_{dd} = 1 - V_t/V_{dd}$$

From these equations, it is apparent that the performance (frequency) of a circuit made up of truly long channel devices is dependent upon the absolute value of the supply voltage. Thus, if the supply voltage to the devices in such circuits is lowered, performance is also lowered. However, in circuits comprised of truly short channel devices, performance is governed by the ratio of threshold voltage to supply voltage (Vt/Vdd). This means that in such circuits the supply voltage to the devices can be lowered with no loss in performance, $f_{max}$, so long as the ratio Vt/Vdd is kept constant. For many devices, this relation is nearly true, and it becomes exactly true for devices in which the saturation voltage scales with the supply voltage.

Although low Vt short channel devices appear attractive for the above reason, special problems have been observed with such devices. First, as Vt is lowered, the leakage current of the transistor—which is the current flowing across the channel region when the transistor is off—increases. For some applications in which the device must frequently switch (e.g., microprocessors), this is not a problem. However, for applications in which the device is normally inactive (e.g., memory devices), the leakage current can cause the device to be quite energy inefficient. Regardless of whether the leakage current represents a significant problem, another problem has been observed with very short channel devices having low thresholds. Specifically, if the distance between the source and drain regions becomes too small, the depletion regions in the channel region adjacent the source and drain can overlap to cause punch through. When this occurs, current flows through the path created by depletion region, even when the transistor is turned "off" (i.e., the gate voltage does not exceed the threshold voltage).

In high threshold voltage devices, it is known that a "buried electrode region" or "ground plane" may be employed to suppress growth of depletion regions in the channel region and thereby prevent punch through. Such devices are described in an article by R. H. Yan, et al., "High Performance 0.1 μm Room Temperature Si MOSFETs," 1992 *Symposium on VLSI Technology Digest of Technical Papers*, pages 86–87, which is incorporated herein by reference for all purposes. Briefly, a buried electrode region is a region of relatively high dopant concentration extending underneath the channel region and having the same conductivity type as the device's bulk or well region. Unfortunately, it was not clear from this work whether such buried electrode regions could have beneficial application in low threshold devices, and if so, how the buried electrode regions could be optimally incorporated into such devices.

What is needed is an improved high performance, short channel transistor device having a low threshold voltage and protection from punch through.

SUMMARY OF THE INVENTION

The present invention provides low threshold voltage MOS devices having buried regions located under the devices' channel regions. As used herein, the term "channel region" refers to the entire electrically active region between the source and drain, not just the inversion layer formed when the gate voltage exceeds Vt. The buried region has the same conductivity type as the device's bulk region (albeit at a higher dopant concentration) and, of course, the opposite conductivity type as the device's source and drain. Its function is to (1) prevent punch through by limiting the growth of depletion regions in the channel region adjacent the source and drain regions, and (2) improve threshold tunability to compensate for process and temperature variations.

In one aspect of the present invention, the buried region takes the form of a "buried electrode region." Such devices can be characterized as including the following elements: (1) a bulk region of a first conductivity type in a semiconductor substrate extending downward from an upper surface of the semiconductor substrate; (2) source and drain regions of a second conductivity type which extend from the semiconductor substrate surface into the bulk region by a predefined distance; (3) a channel region located between the source and drain regions; (4) a buried electrode region of the first conductivity type within the bulk region having an upper boundary located at or above the first predefined distance, the buried electrode region having a dopant concentration that is greater than the average dopant concentration in the bulk region; and (5) a gate positioned over the channel region.

In another aspect of the invention, a similar MOS structure is employed, but rather than having a buried electrode region, it has a "retrograde well" of the first conductivity type to prevent punch through. The retrograde well region extends downward from an upper surface of a semiconductor substrate and has a graded dopant concentration profile such that the dopant concentration is greater near the bottom of the well region.

The concentration of dopant in the buried region (buried electrode region or bottom of a retrograde well) should be sufficiently high to diminish the likelihood of punch through in the MOS device. In a preferred embodiment, the dopant concentration in the buried electrode region (or bottom region of a retrograde well) is between about 10 and 100 times greater than an average dopant concentration in the bulk region (or well region). In 0.35 μm technology (i.e., the gate poly length is about 0.35 μm and the gate oxide is about 65 Å thick), the buried region preferably has a dopant concentration of at least about $1\times10^{16}$ atoms/cm$^3$, and more preferably between about $1\times10^{16}$ and $1\times10^{18}$ atoms/cm$^3$.

The device is also structured such that it has a ratio of "on current" to "off current" that is at most about $10^5$. The on current is the current that flows between the device's source and drain when the device is "on," i.e., when there is strong inversion in the channel region (Vds=Vdd=Vgs). The off current is the current flowing between the device's source and drain when the device is off (Vds=Vdd; Vgs=0). The off current is synonymous with "leakage current." Devices with such low ratios of on current to off current have low threshold voltages (e.g., between about ±150 mV). Such low threshold voltages may be obtained by various techniques well known in the art. In one of these, the dopant concentration in the channel region is maintained at a relatively low level For example, in 0.35 μm technology, the channel region dopant concentration generally should be held to at most about $1\times10^{16}$ atoms/era$^3$ and preferably between about $1\times10^{14}$ and $1\times10^{16}$ atoms/cm$^3$. However, in some embodiments, it may be desirable to add a counterdopant in the channel region to further lower the threshold voltage.

In preferred embodiments, it will generally be desirable to provide the device with a tunable gate threshold voltage by, for example, providing back biasing capability. This allows the absolute value of the threshold voltage to be adjusted to account for inevitable process and environmental (e.g., temperature) variations which can each change Vt by on the order of about 100 millivolts.

In further preferred embodiments, the dopant concentrations in the source and drain regions are relatively high so that the series resistance in the device is low. If the device has tip regions in the source and/or drain, these may have dopant concentrations of, for example, about $4\times10^{19}$ to $8\times10^{19}$ atoms/cm$^3$.

Another aspect of the present invention provides a method of fabricating a MOS transistor. The method includes the following steps: (1) forming a bulk region of a first conductivity type having a buried region also of the first conductivity type, which buried region has an average dopant concentration that is at least about 10 times greater than an average dopant concentration in the bulk region excluding the buried region; (2) forming source and drain regions of a second conductivity type separated by a channel region which channel region is disposed above said buried region; and (3) forming a gate over said channel region, wherein the conditions employed to form the channel region are such that the MOS transistor has a low threshold voltage (e.g., the ratio of an on current to an off current of at most about $10^5$). In order to produce a device having a low threshold voltage, the process should maintain the "net" concentration of dopant atoms in the channel region (of the first conductivity type) at level of not greater than about $1\times10^{16}$ atoms/cm$^3$. The net concentration refers to the concentration of dopant atoms of the first conductivity type in excess of the concentration of dopant atoms of the second conductivity type. Preferably, there will be no significant concentration of dopant atoms of the second conductivity type in the channel region and the net concentration will equal the total concentration.

The step of forming a bulk region may form either a buried electrode region within the bulk region or a retrograde well. If a buried electrode region is formed, preferably, a separate step of forming the buried electrode region is conducted at a dose of between about $5\times10^{12}$ to $1\times10^{13}$ atoms/cm$^2$ and at an energy of between about 80–120 keV. In some embodiments, the step of forming the bulk region includes at least three implant steps conducted at energies and dosages sufficient to define a buried electrode region within a well region.

These and other advantages of the present invention will become apparent to those skilled in the art after reading the following descriptions and studying the various figures of the drawings.

BRIEF DESCRIPTION OF THE DRAWINGS

FIGS. 4A–4J are side sectional views of a partially completed transistor in accordance with this invention at various stages of fabrication.

DETAILED DESCRIPTION OF THE INVENTION

In the following description of preferred embodiments, various dopant concentrations are specified. It should be understood that these concentrations are most appropriate for devices having drawn channel region lengths of about 0.35 μm (corresponding to effective channel lengths of about 0.25 μm) and gate oxide thicknesses of about 65 Å. It should also be understood that dopant concentrations in devices generally vary inversely with device size; as device size decreases, the dopant concentration increases. This is because (1) depletion regions adjacent source and drain regions must scale with channel region width to prevent punch through, and (2) to shrink the depletion regions, dopant concentrations must increase. As this invention is not limited to 0.35 μm technology, the concentrations set forth below are exemplary only. It should be expected that the recited concentrations will be increased as necessary to reduce depletion region sizes in smaller devices (less than about 0.35 μm). Likewise, in larger channel devices, the recited concentrations may be decreased.

Figure 1:
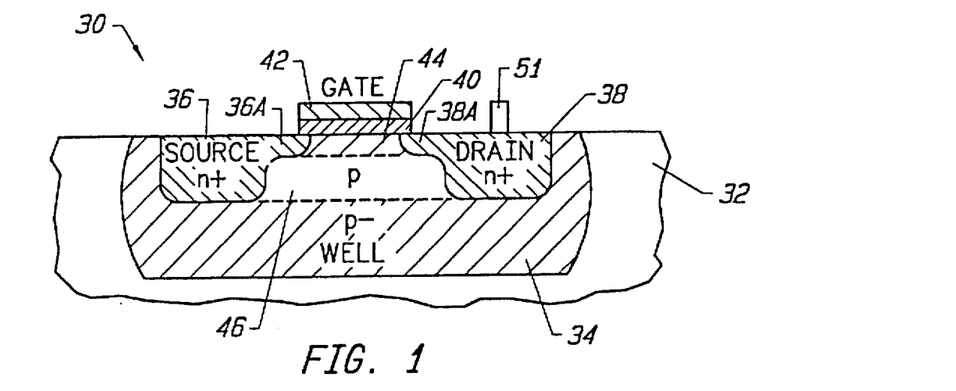
FIG. 1 is a side sectional view of a transistor having a buried electrode region and a gate threshold voltage controllable by back biasing in accordance with the present invention.

FIG. 1 is a side sectional view of a MOSFET 30 of the present invention having a low threshold voltage and improved performance. The specific transistor 30 shown in FIG. 1 is an NFET; i.e., it has an n-type source and drain, and a p-type well. Although not shown, transistor 30 could also be a PFET transistor having a p-type source and drain, and an n-type well.

Transistor 30 includes a lightly doped well region 34 extending downward from the surface of a semiconductor substrate 32 into its bulk. The bulk semiconductor may also be lightly doped, thus obviating the need for a separate well region. Preferably, the well region—excluding source, drain, and buried electrode regions—has an average dopant concentration of between about $1\times10^{14}$ and $5\times10^{16}$ atoms/cm$^3$. A heavily doped n-type source "plug" region 36 with an associated "tip" 36A and a corresponding heavily doped drain "plug" region 38 with an associated tip 38A are provided in well region 34 as shown. The dopant concentrations of the source plug region 36 and drain plug region 38 are each preferably between about 1 and $2\times10^{20}$ atoms/cm$^3$. The dopant concentrations of the tips are between about 4 and $8\times10^{19}$ atoms/cm$^3$. In some embodiments, the source or drain will be shaped such that it does not have a tip; rather the plug portion of the source or drain will extend up to the channel region. Such devices will have lower source or drain resistances.

A channel region 44 having a relatively low dopant concentration of at most about $1\times10^{16}$ atoms/cm$^3$ (more preferably between about $1\times10^{14}$ and $1\times10^{16}$ atoms/cm$^3$, and most preferably about $1\times10^{15}$ atoms/cm$^3$) extends between the source and drain tip regions 36A and 38A. Such low doping concentrations in the channel region allow the device threshold voltage to be set at or near zero volts (either positive or negative). In preferred short channel devices of the present invention, the source and drain regions are positioned such that the inner boundaries of the tip regions are no more than about 2 μm apart, and are more preferably in the range of about 0.5 μm or less. As noted, the dopant concentrations presented herein are most appropriate for about 0.35 μm devices. It should be borne in mind that many advantages of the device structures of this invention also apply to longer channel devices.

A gate oxide layer 40 is provided on the surface of the p-type well 34 and overlying the channel region 44. In preferred embodiments (for 0.35 μm devices), gate oxide layer 40 is preferably about 65 Å thick. An n-type gate layer 42 is provided on the oxide layer 40 as shown. In general for the low threshold voltage devices of this invention, gate layer 42 will be n-type in NFETs and p-type in PFETs. In high threshold voltage PFETs, in contrast, the gate layer is typically made n-type.

Contacts (not shown) are provided for the source, drain, and gate regions respectively. In addition, a separate electrical contact (also not shown) may be provided for well region 34 so that the potential between the source and well regions can be controlled by an external circuit. This provides the capability of controlling the threshold voltage through back biasing as will be explained below. In devices having this capability, the well may be engineered to provide a relatively low-resistance path along its bottom side so that the well potential is nearly uniform. For example, a high concentration of dopant may be provided along the well bottom. Further, to ensure a good ohmic contact between the lightly doped well region and the well's electrical contact, it may be necessary to provide a heavily doped region (p-type for NFETs and n-type or PFETs) adjacent to the well contact. The various device contacts may be electrically isolated from one another and from gate 42 by an oxide, glass, or other insulating layer (sometimes referred to as a passivation layer).

A buried electrode region 46 is provided in well 34 extending between the facing sides of source and drain plug regions 36 and 38 and below channel region 44. Specifically, it is located below source and drain tip regions 36A and 36B. The buried electrode region 46 has a "p" concentration that is somewhat higher than the surrounding "p-" region of well 34. Preferably, the dopant concentration of buried region 46 is at least about $1\times10^{16}$ atoms/cm$^3$, and more preferably between about $1\times10^{16}$ and $1\times10^{18}$ atoms/cm$^3$. These ranges apply for both NFETs and PFETs. In a specific preferred embodiment, the well and buried region have a vertical profile with a concentration of about $1\times10^{15}$ atoms/cm$^3$ at the interface of gate oxide 40 and channel region 44, about $5\times10^{16}$ atoms/cm$^3$ at the edge of the gate-bulk depletion region (about 0.15 μm from the gate oxide), and about $1\times10^{15}$ atoms/cm$^3$ at a depth shallower than the source-drain junction (about 0.25 μm from the gate oxide) to minimize junction capacitance. In a PFET device, of course, the buried electrodes region is a region of n-type dopant having a similar profile.

High Vt devices having buried electrode are described in the article by R. H. Yan, et al., "High Performance 0.1 μm Room Temperature Si MOSFETs," 1992 *Symposium on VLSI Technology Digest of Technical Papers*, pages 86–87, which was previously incorporated herein by reference. In that article, a buried electrode region or "ground plane" concept is described with respect to conventional high Vt CMOS transistors. The authors were attempting to maintain protection against punch through while improving the charge carrier mobility in high Vt devices by reducing the channel region dopant concentration. By decreasing the channel region dopant concentration, the authors created a device having a relatively increased dopant concentration (the ground plane) below the channel region surface.

In an alternate embodiment of the present invention, a retrograde well is used in place of a buried electrode region as described above. In this embodiment, the well region 34 has a graded dopant concentration profile in which the dopant concentration in the well gradually increases from the semiconductor upper surface into the body of substrate 32 until a point is reached below the channel region. Thus, the concentration of the dopant is lowest in the channel region and highest at a location proximate the bottom of the well. For example, a device employing a retrograde well might have a dopant concentration of $1\times10^{16}$ atoms/cm$^3$ at the channel region/gate oxide interface and a downward increasing dopant concentration which reaches a maximum of about $1\times10^{17}$ atoms/cm$^3$ at a depth of about 0.3 μm from the gate oxide surface. At further depths, the concentration rapidly drops back to $1\times10^{16}$ atoms/cm$^3$. In general, devices having retrograde wells do not have as high performance as comparable devices having buried electrode regions because their concentration profiles do not have abrupt changes. However, such devices are typically less costly to produce, since a separate step of forming a buried electrode region is not required.

It should be noted that the embodiment shown in FIG. 1, as well as all other embodiments discussed herein, could profitably be employed with a silicon on insulator ("SOI") structure—as distinguished from a conventional MOS structure in which device elements are formed in a monolithic silicon substrate. SOI structures include a base layer of bulk silicon on top of which is provided a layer of bulk silicon dioxide. Finally, on top of the silicon dioxide layer, a thin, partially depleted, epitaxial layer of silicon—typically in the range of 1000 to 2000 angstroms—is provided to form the device elements (source, drain, channel region, and buried electrode region structure).

As noted, it is generally preferable to engineer the device so that the threshold voltage in the channel region is quite low. Often this can be achieved by simply maintaining a low dopant concentration in the channel region. However, in some cases, additional steps must be taken. This is most often necessary when the polysilicon layer of an integrated circuit is doped by ion implantation (as opposed to simply forming a doped poly layer). Poly layers doped by ion implantation—which are now commonly used—can have different work functions than unimplanted poly layers, leading to higher threshold voltages. To offset this effect, the channel region may be counterdoped with n-type dopants (in NFETs). Preferably, the counterdopant concentration in the channel region will be between about $1 \times 10^{16}$ and $1 \times 10^{17}$ (a counterdopant dose of $7 \times 10^{11}$ ions/cm$^2$ will under the normal conditions shift Vt by about 200 mV with a 65 Å oxide, provided all the dopant remains within the channel region).

While not wishing to be bound by theory, it is believed that the following discussion explains how a buried electrode region (or retrograde well) allows short channel, low Vt devices to function properly. As noted, a low channel region dopant concentration (or a counterdopant or both) or both is needed to achieve a low threshold voltage (Vt) in a CMOS transistor, and permit the use of a low supply voltage (Vdd). The low channel region concentration increases the mobility of the charge carriers in the channel region, but also increases the likelihood of punch through. As noted, the source-drain depletion regions extending into the channel region increase in size with low dopant concentrations. Punch through, as mentioned above, is the condition occurring when these source and drain depletion regions overlap and allow charge carriers to flow from source to drain, even when the transistor is "off."

The buried electrode region 46 allows the advantages of a low dopant concentrations in the channel region to exist while reducing the likelihood of punch through. The depletion regions adjacent the source and drain regions normally begin forming in the bulk well region 34 below the gate where there is a low vertical field strength. By providing a buried electrode region of higher dopant concentration below the channel region, the growth of the depletion regions is immediately slowed. Since the source-drain depletion regions cannot extend across the channel region 44, charge carriers will not flow across the channel unless the transistor is turned on (i.e., Vg is greater than Vt). The buried electrode region thus prevents punch through. And, because there still is a low dopant concentration in the channel region 44, the benefits of a low vertical electric field adjacent the silicon/oxide interface and high mobility of charge carriers are not reduced.

Buried electrode region also allow a device's threshold voltage to be effectively tuned by back biasing. As explained in more detail below, low threshold voltage devices must be tunable over a range of Vts to adjust for inevitable environmental and process variations which slightly shift Vt. Adequate tunability is normally quite difficult to attain in low Vt devices because of the low dopant concentrations in their channel and bulk regions. These low concentrations cause the device's depletion regions to quickly grow downward into the bulk when a bias of appropriate polarity is applied to the semiconductor bulk (as is typically done to tune a device by back biasing). When this occurs, a device cannot effectively be backbiased because the depletion region extending into the bulk masks out the potential of the bulk region—which is needed to tune the threshold voltage. A buried electrode region overcomes this difficulty by effectively blocking the downward growth of the depletion region when a bias is applied to the substrate bulk in connection with back biasing.

As noted, the devices of this invention should have quite low threshold voltages. Generally, low threshold devices (such as those of this invention) have relatively large leakage currents, a feature which, in the past, led engineers to design devices having relatively high threshold voltages. Thus, conventional devices are designed to have a ratio of "on current" to "off current" (a measure of leakage current) of at least about $10^6$ and typically in the range of $10^7$ to $10^8$. Such high ratios may be appropriate for relatively inactive circuits such as RAM cells. However, in more active circuits typically used in microprocessors, the leakage current may be of less concern, in which case the threshold voltage can be substantially lowered. The present invention is primarily concerned with such low threshold voltage devices. Therefore, the devices of the present invention will preferably be characterized by a ratio of on current to off current of at most about $10^5$, and more typically about $10^2$–$10^3$. For some highly active devices, it may even be desirable to have a ratio of on current to off current of as low as 10. In terms of absolute threshold voltage, the MOS devices of this invention will preferably have a Vt of between about $-150$ and $+150$ millivolts. However, this range is not critical to the practice of the invention.

Figure 2:
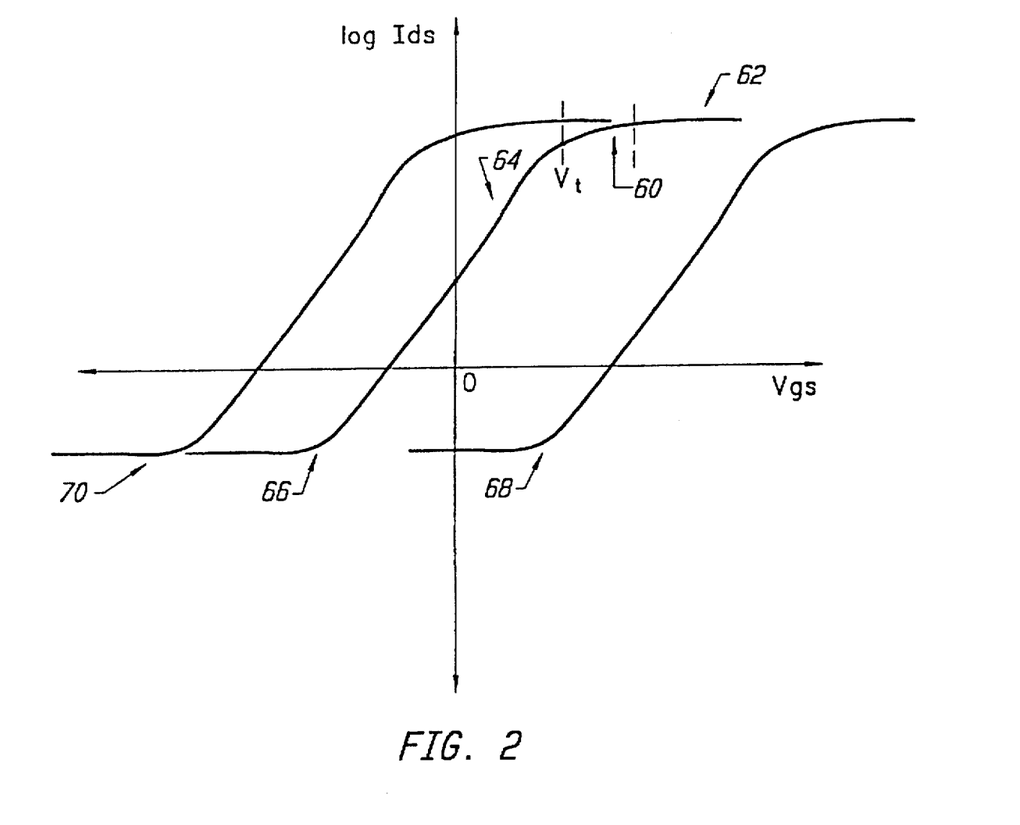
FIG. 2 is graph showing a typical family of device current ($I_{ds}$) versus gate voltage ($V_{gs}$) curves for transistors having differing channel region dopant concentrations.

FIG. 2 shows a family of log $I_{ds}$ (logarithm of channel current) versus $V_{gs}$ (gate voltage) curves for different devices operated at constant Vds. Each curve is provided for a different channel region dopant concentration, with curves having subthreshold regions at lower (more negative) gate voltages describing devices having lower channel region dopant concentrations in accordance with the present invention. Referring to curve 66—which describes a device in accordance with this invention—a threshold voltage (Vt) is provided where subthreshold region 64 and transition region 60 meet. A strong inversion region 62 exists beyond transition region 60 and is characterized by a linear current profile with increasing $V_{gs}$. With all other device variables being equal, curves 70 and 68 describe devices having lower and higher channel region dopant concentrations, respectively, than the device described by curve 66. The subthreshold Vg versus I slope is generally given by the equation, Ms=n $V_T$ 1 n(10), where Ms is the subthreshold slope, n is ideally 1, and $V_T$ is the thermal voltage, defined by kT/q. Thus, the subthreshold slope becomes steeper with decreasing temperature.

As noted, the device's threshold voltage will be at or near zero, in the region preferred for this invention. Due to processing variations, the exact dopant concentration in the channel region can vary slightly from device to device. Although these variations may be slight, they can shift a device's threshold voltage by a few tens or even hundreds of millivolts (to outside of the preferred range for operation of this invention). Further, environmental factors such as operating temperature fluctuations can shift the threshold voltage. Thus, it is desirable to provide a mechanism for tuning the threshold voltage in low threshold voltage devices such as those of this invention. As noted above this can be accomplished by using back biasing, i.e. controlling the potential between a devices well and source. See James B. Burr, "Stanford Ultra Low Power CMOS," Symposium Record, Hot Chips V, pp. 7.4.1–7.4.12, Stanford, Calif. 1993 which is incorporated herein by reference for all purposes.

Back biasing is accomplished by controlling the potential difference between the source and well regions of the transistor. Typically, the potential will be controlled through isolated ohmic contacts to the source and the well regions together with the circuitry necessary for independently controlling the potential of these two regions. As the potential difference is increased, the magnitude of the threshold voltage increases. In general, a relatively large back bias voltage is required to adjust the threshold voltage a comparatively small amount. In preferred embodiments, the device will be engineered such that 1 volt of back bias applied to the bulk will produce a shift in threshold voltage of about 50 to 300 millivolts (more preferably about 75 to 200 millivolts, and most preferably about 100 millivolts).

Back biasing can be implemented using various automatic techniques. In one such method, a feedback amplifier adjusts the bias voltage of a well so that the drain current of a test device in the well matches a reference current. A tuning circuit can be designed to match the off current (in the range of 1 nanoamp/micrometer to 1 microamp/micrometer), or the on current (in the range of 100 microamps/micrometer), or some function of both the on and off currents. Such circuits can sample the current from several test devices to obtain average on and off currents. The power dissipation of one of these well-tuning circuits is typically quite small, on the order of 1 microwatt, and its area is also small, typically about 10,000 square micrometers, so that hundreds or even thousands of such circuits can be distributed throughout an integrated circuit chip without significantly impacting area or power, while substantially improving low voltage performance by providing tightly controlled operating environments over small, local transistor populations.

Figure 3:
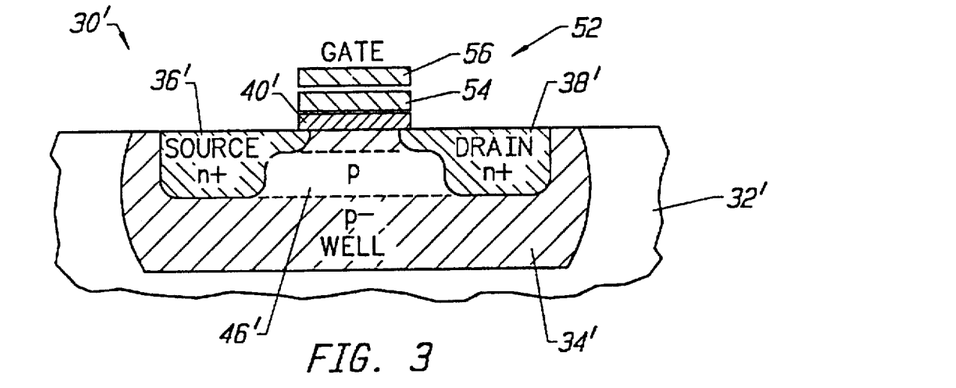

FIG. 3 shows an alternative embodiment of a short channel MOSFET transistor 30' having a low threshold voltage that is tunable by a floating gate. Like the embodiment shown in FIG. 1, the transistor 30' of FIG. 3 includes well region 34', source region 36', and drain region 38'. Transistor 30' also includes a buried electrode region 46' having a relatively high concentration of dopant extending between the source and drain in a relatively lightly doped bulk well 34'. MOSFET 30' includes two gate layers in a floating gate structure 52. First gate layer 54 is deposited on oxide layer 40', and second gate layer 56 is deposited above first gate layer 54 on an insulating layer. As is known in the art, a fixed voltage (and associated charge) may be applied to first gate 54 to control the threshold voltage of gate 56. Thus, by using the floating gate structure 52, the Vt of the transistor 30' can be electrically controlled in much the same manner as by using back biasing.

FIGS. 4A–J illustrate some of the important steps in the fabrication of an MOS device (an NFET in this example) in accordance with the present invention. It should be understood that numerous variations of this process are permissible and within the scope of this invention. For example, although this process is described in terms of an NFET, it could apply equally to a PFET if the conductivity types of the dopants were to be reversed. Still further, it should be understood that the conditions recited herein are appropriate for devices in the size neighborhood of 0.35 μm. The process conditions may have to be modified somewhat for devices in other size regimes, as is known in the art.

Figures 4A, 4B, 4B, 4B, 4C, 4D:
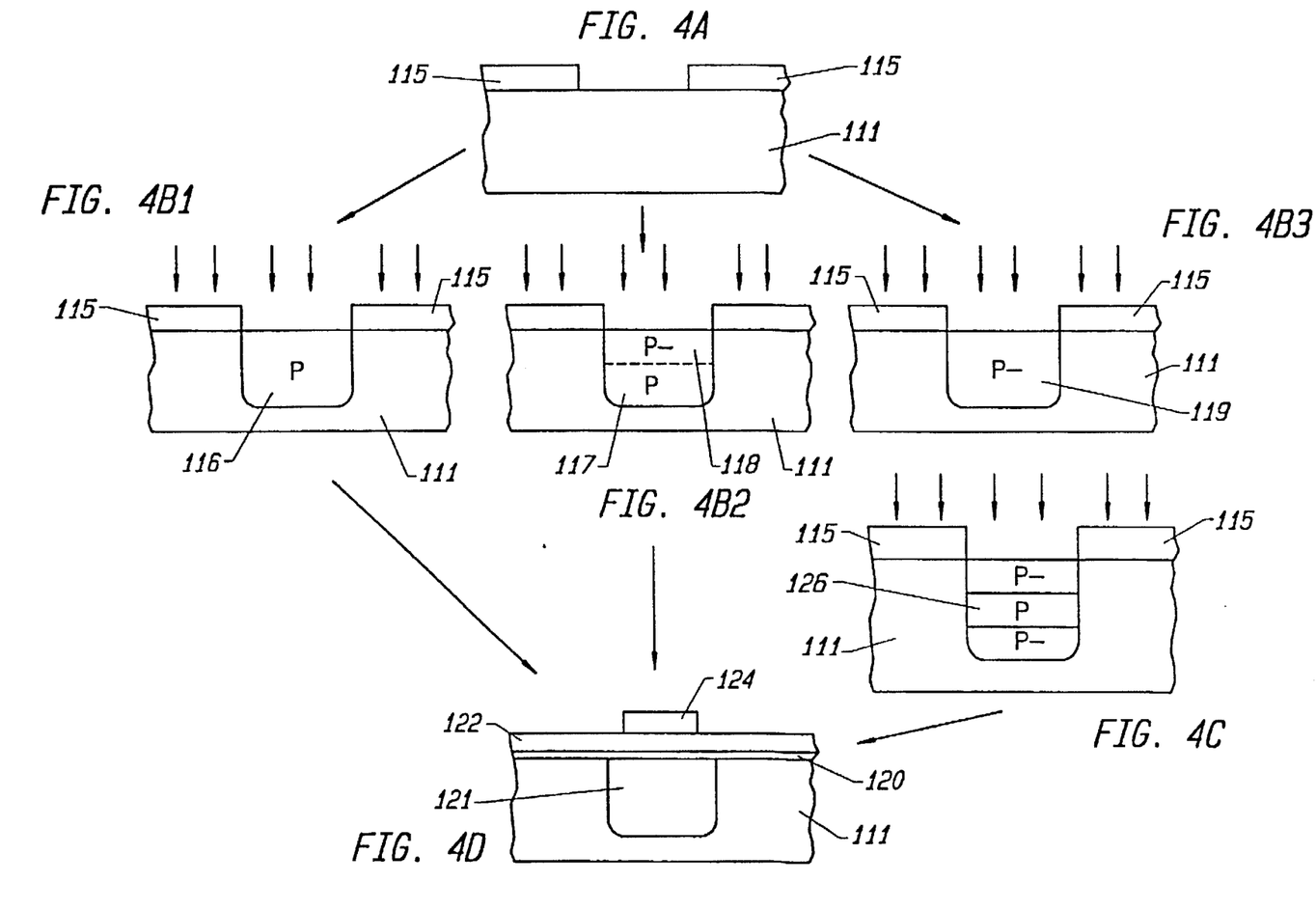

In FIG. 4A, a substrate 111 of silicon or other suitable semiconductor material is provided with an ion implant mask 115 of a photoresist or other suitable masking material which exposes a selected portion (the "p-well portion") of substrate 111.

In FIGS. 4B1, 4B2, and 4B3 a p-type ion implant is performed over the substrate, penetrating the unmasked portion of the substrate 111 (the "p-well portion"). Three options for this procedure are shown in FIG. 4B. FIG. 4B1 illustrates this process for a standard process. In such cases, the p-type dopant is provided at a dose and energy sufficient to provide a lightly doped well region 116. For example, the implant might be conducted at a dose of $1 \times 10^{12} - 5 \times 10^{12}$ atoms/cm$^2$ and at an energy of 150–180 keV. A subsequent diffusion anneal is conducted at a temperature and for a time sufficient to smooth out the p-type dopant concentration over well region 116 and give a relatively uniform very light p-doping level.

FIG. 4B2 illustrates a p-well implant step used to form a retrograde well in accordance with one embodiment of this invention. The implant is conducted at a dosage and energy such that a very lightly doped region 118 is formed near the top of the well region, while a less lightly doped region 117 is formed near the bottom of the well region. For example, boron may be implanted at a dose of between about $1 \times 10^{12}$ and $5 \times 10^{12}$ atoms/cm$^2$, and between about 180 and 250 keV. The resulting well dopant concentration profile in which the dopant concentration increases toward the lower regions of the well away from the substrate surface is a defining characteristic of retrograde wells. Typically after the well implant, only a very limited diffusion anneal is conducted so that the graded dopant profile remains largely intact.

FIG. 4B3 shows the first step of a two-part well implant which is conducted to form a buried electrode region in the well region in accordance with a preferred embodiment of this invention. Initially, a p-type dopant is implanted at a dose and energy sufficient to form a very lightly doped well region 119. For example, the implant might be conducted with boron at an energy of about 150 to 180 keV and a dose of between about $1 \times 10^{12}$ to $5 \times 10^{12}$ atoms/cm$^2$. A subsequent diffusion anneal is conducted at a temperature and for a time sufficient to smooth out the p-type dopant concentration over well region 116 to give an overall light p doping level. For example, the anneal could be conducted for about 1 to 3 hours at between about 950° and 1050° C. Next, as shown in FIG. 4C, a second p-type dopant implant is conducted at an energy and dosage sufficient to form lightly doped buried electrode region 126 between the two very lightly doped (p-) regions remaining in well region 119. For example, the buried electrode region might be formed by a boron implant of about $5 \times 10^{12}$ to $1 \times 10^{13}$ atoms/cm$^2$ at an energy of between about 80 to 120 keV.

The well formation conditions should be chosen such that the p-well region has a dopant concentration at the substrate surface (i.e., the channel region) of between about $1 \times 10^{14}$ and $1 \times 10^{16}$ atoms/cm$^3$ (as discussed above). It should be noted that, in many systems, there is no explicit p-well. Rather, the silicon wafers used to make the devices are grown with a specific dopant concentration. Alternatively, in an epitaxial process, a layer of silicon of the desired bulk concentration is provided on top of a heavily doped substrate.

It should be noted that the standard process and the retrograde well process do not include a second implant step for providing a buried electrode region. Thus, from the standpoint of process efficiency, devices having retrograde wells may be more desirable than comparable devices having buried electrode regions. However, by performing multiple implants, the dopant concentration gradient at the top edge of the buried electrode region will be steeper, thus providing improved device performance as explained below.

Figure 5:
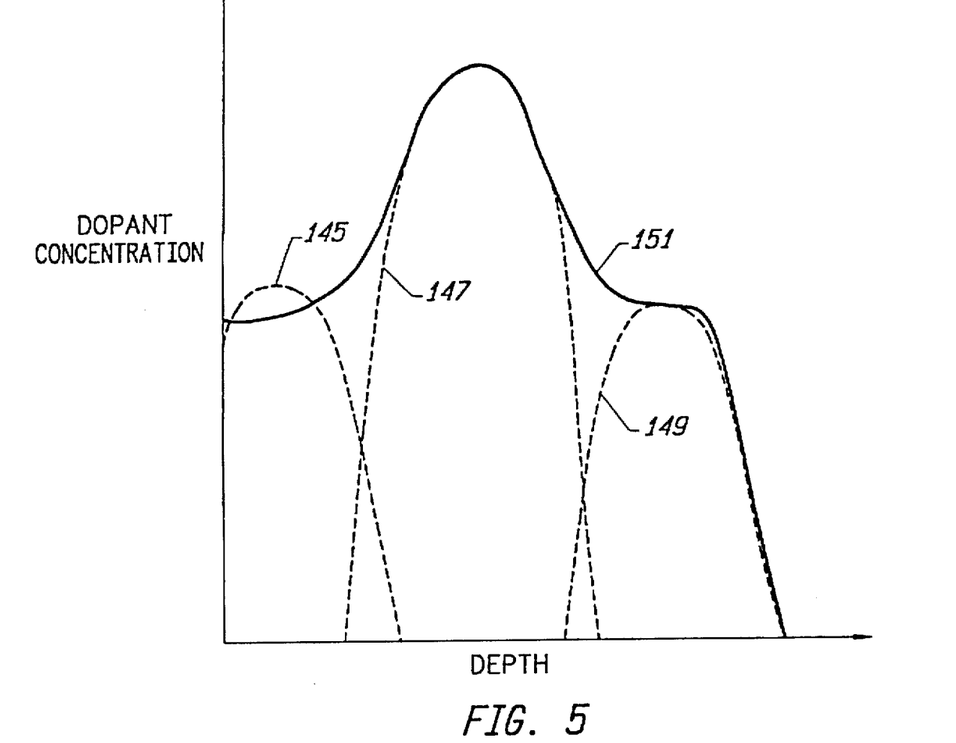
FIG. 5 is a plot of dopant concentration versus distance into a semiconductor substrate for three ion implants used to form a well region including a buried electrode region in accordance with this invention.

In an alternative preferred embodiment, the buried electrode region is formed by three separate implant steps, each conducted under carefully tailored conditions. FIG. 5 illustrates the approximate dopant concentration profiles of these three implants and the overall dopant concentration profile of a well region formed by these implants. Specifically, a first boron implant conducted at an energy of between about 10–30 keV and at a dose of about $5 \times 10^{11}$ to $5 \times 10^{12}$ atoms/cm$^2$ produces a dopant concentration profile approximated by curve 145 in FIG. 5. A subsequent boron implant conducted at between about 80–120 keV and at a dose of about $5 \times 10^{12}$ to $1 \times 10^{13}$ atoms/cm$^2$ produces a dopant concentration profile approximated by curve 147 in FIG. 5. This curve corresponds to the "buried electrode region" produced by this embodiment. Finally, a third boron implant conducted at an energy of between about 180–250 keV and at a dose of about $1 \times 10^{12}$ to $5 \times 10^{12}$ atoms/cm$^2$ produces a dopant concentration profile approximated by curve 149. Together the three implants provide the desired concentrations profile 151.

Although the various processes described above produce different dopant concentration profiles in the p-well region, subsequent discussion of the fabrication flow will refer to the p-well region by the reference number 121. It should be understood that this reference number is intended to cover both buried electrode region and retrograde well structures.

To obtain the structure shown in FIG. 4D, the mask 115 is removed and a pad oxide 120 (silicon dioxide) covering the substrate 111 is grown to a thickness of between about 30 and 80 nanometers at a temperature in the range of about 700° to 1300° C. Next, a layer of silicon nitride 122 is deposited, typically by low pressure vapor chemical deposition (LPCVD), to a thickness of between about 0.1 and 0.2 micrometers on pad oxide 120. Thereafter, a resist mask 124 is provided to protect the active areas (i.e., regions were active transistors are to be formed).

Figure 4E:
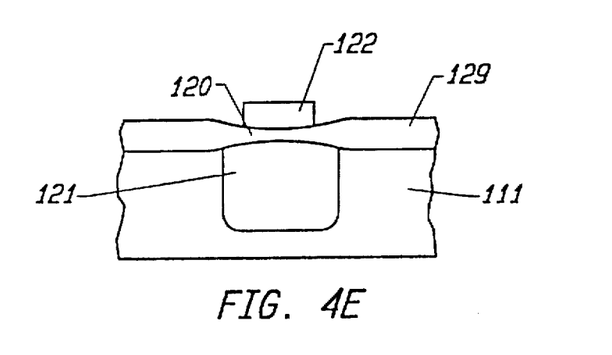

The structure shown in FIG. 4E is then prepared as follows. A dry etch (typically a reactive ion etch or PIE) is performed on the exposed nitride and oxide layers to produce a bare silicon surface in these regions. An optional channel stop implant is conducted at this point—preferably with boron at an energy of about 20–30 keV and a dose of $5 \times 10^{12}$ to $1 \times 10^{13}$ atoms/cm$^2$. For the low voltage systems preferred in this invention, even lower implant energies may be appropriate. Alternatively, trench isolation may be employed to insulate individual devices.

Figure 4F:
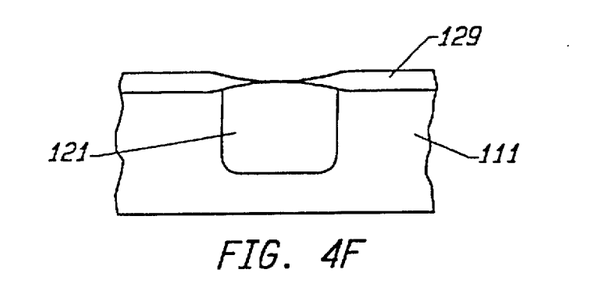
Figure 4G:
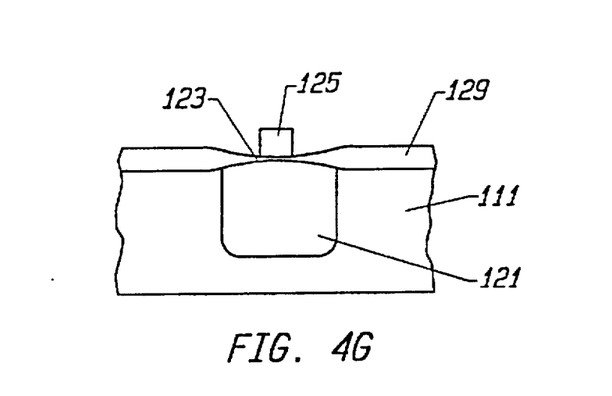
Figure 4H:
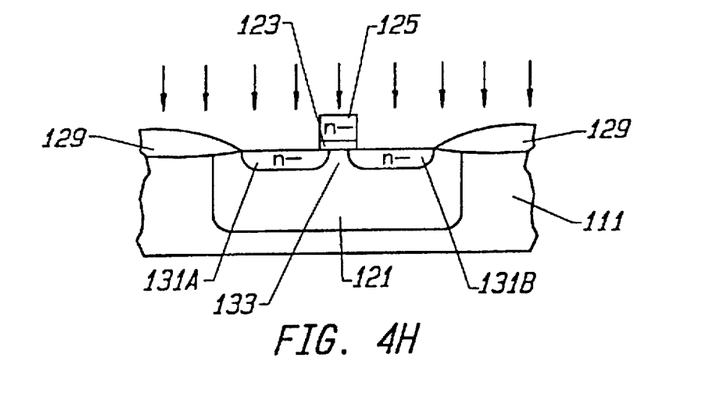

Next, the resist mask is removed and a thick field oxide 129 (silicon dioxide) is grown at a temperature of between about 700° and 1300° C. to a thickness of between about 0.2 and 0.5 micrometers to produce the structure shown in FIG. 4E. Thereafter, this structure is selectively etched to remove nitride layer 122, typically by a wet etch with orthophosphoric acid. A timed wet etch is then performed to remove the pad oxide 120 and expose the silicon substrate in the active device regions. This produces a structure as shown in FIG. 4F.

In an alternative embodiment, preparation of the buried electrode region is deferred until this point in the process. According to this embodiment, an implant is conducted at the same dosage and energy ranges as discussed above in connection with FIGS. 4B3 and 4C. The only difference is that the total extent of the buried electrode region implant over the substrate surface is greatly restricted. As the field oxide effectively masks all but the active regions of the substrate, the buried electrode region is confined to these active regions. This approach has two advantages. First, the buried electrode region occupies far less area. That is, it is limited to device active regions as opposed to entire well regions—which sometimes span multiple device. This reduces the sidewall capacitance of the devices. Second, the buried electrode region will have a steeper dopant concentration profile at its upward facing junction (i.e., the junction closest to the channel region) because the buried electrode region implant is conducted later in the process and is therefore subjected to less high temperature processing. This improves device performance by decreasing the vertical field in the channel region.

After the bare silicon substrate has been exposed, a thin gate oxide 123 is grown on the silicon surface at a temperature of between about 800° and 950° C. to a thickness of between about 5 and 15 nanometers. Typically, the gate oxide will be a single layer of silicon dioxide, but it may also be a multi-layer structure including silicon nitride. (Technically, such multi-layer structures should be referred to as "gate dielectrics.") After the gate oxide or gate dielectric has been formed, a gate layer of polysilicon is deposited over the surface to a thickness between about 100 and 300 nanometers. On this layer, a resist mask is defined to protect the transistor gate region. Then, the exposed polysilicon is selectively etched and the resist mask is removed to provide the structure shown FIG. 4G.

Next, an n-type ion implant is conducted at an ion dose of about $10^{13}$–$10^{14}$ atoms/cm$^2$ and an ion kinetic energy of between about 20 and 60 keV with ions drawn from P, As, Sb, or Sn. This implant is performed over the NMOS regions of the substrate, penetrating the p-well portion of the apparatus to form two n doped layers 131A and 131B, shown in FIG. 4H, flanking a p-type channel region 133 to the left and right, respectively, within the p-well 121. This implant is intended to form a device's source and drain "tip" regions which extend to the edge of the channel region. In preferred embodiments, the junctions between these tip regions and the adjacent channel region have steep dopant concentration gradients. Thus, subsequent processing should be conducted under conditions which minimize dopant diffusion in these tip regions. To the extent possible, this will generally require conducting subsequent heating steps at relatively low temperatures and for relatively short times.

Figure 4I:
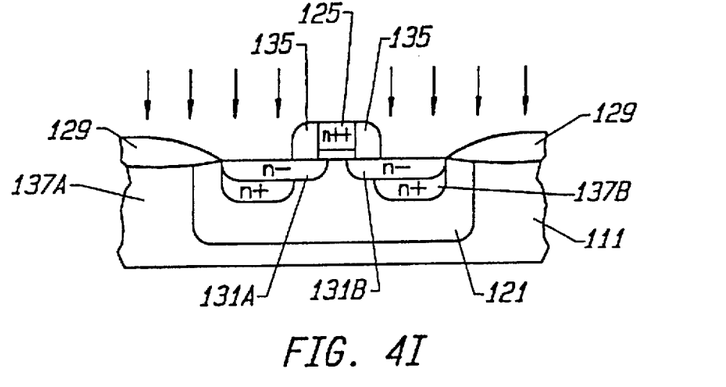

After the tip regions have been formed, "plug" regions 137A and 137B of the source and drain shown in FIG. 4I are optionally formed as follows. First, a blanket oxide insulating layer is deposited over the device. Most of this layer is selectively etched away, leaving side wall insulating spacers 135 of width 0.1–0.2 μm, flanking the polysilicon gate 125 on the right and left as shown in FIG. 4I. Thereafter, an n+ion implant (ion dose=$1 \times 10^{15}$–$5 \times 10^{15}$ atoms/cm$^2$; ion kinetic energy=50–100 keV; arsenic ions or possibly antimony or tin ions) is performed over the substrate, penetrating the p-well portion of the structure. This produces drain and source layers 137A and 137B of increased n-type doping. An anneal step is thereafter performed. Preferably, this is the only anneal step conducted for the tip and plug implants. Thus, the tip regions 131A and 131B will tend to maintain a steep concentration gradient near the channel region.

For short channel devices (less than about 0.1 micrometer channel lengths), the order the "tip" and "plug" implants of the source and drain regions may be reversed. In this alternative embodiment, the side wall spacers 135 are formed before any source drain implants. Then, the source/drain plug implant is performed under the conditions described above. After this, the spacers are removed and the "tip" implants are performed to produce source and drain regions having the profiles illustrated in FIG. 4I. The advantage of this approach is that it produces the tip regions later in the process, thereby better preserving the steep dopant concentration gradients at the tip-channel junctions.

In still another embodiment, source and drain regions include—in addition to the tip regions—structures rising above the silicon substrate surface. Such structures will typically be silicides having relatively low resistance. In this embodiment, the plug implants are not performed. Thus, the overall resistance of the source and drain regions is maintained at a relatively low level without providing plugs in the silicon substrate.

Figure 4J:
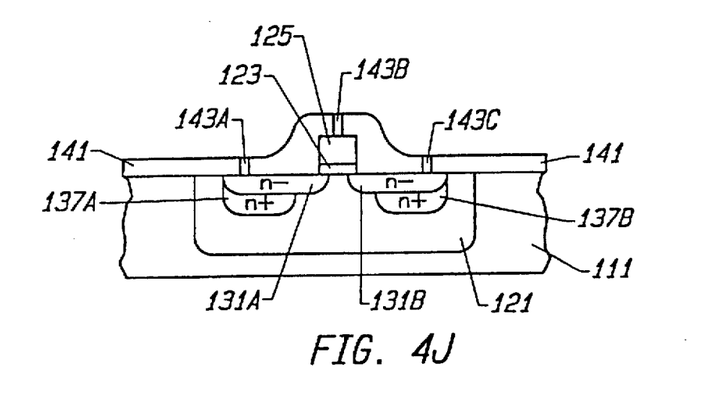

After the source and drain regions have been formed, an insulating layer 141 is formed over the device as shown in FIG. 4J. Apertures or vias 143A, 143B, and 143C are then selectively etched in the oxide layer 141 and filled with metal, such as aluminum, tungsten, titanium or other electrically conductive material to provide electrical contacts for the drain 131A, gate 125, and source 131B.

It should be noted that the process depicted in FIGS. 4A–4J includes no channel region implants of the type which produce devices having high dopant concentrations in the channel region and consequently high threshold voltages. In fact, the dopant concentration in the channel region is preferably maintained at a level of less than about $1 \times 10^{16}$ atoms/cm$^3$, and more preferably between about $1 \times 10^{14}$ and $1 \times 10^{16}$ atoms/cm$^3$. Most preferably, the channel region dopant concentration is about $1 \times 10^{15}$ atoms/cm$^3$, which is substantially lower than the 1 to $5 \times 10^{17}$ atoms/cm$^3$ for conventional 0.35 μm high threshold voltage devices. Of course, the threshold voltage can be kept near zero even in devices having higher dopant concentrations so long as the "net" concentration of dopant atoms of a particular conductivity type is maintained at a low level. This condition can be attained by, for example, conducting two (or more) channel region implants of opposite conductivity type, so that the effects of the two implants offset one another somewhat. Of course, it will generally be preferable to fabricate low Vt devices without conducting such offsetting implants in the channel region, as implants generally degrade the condition of the semiconductor lattice.

As noted, one of the purposes of the buried electrode region is to achieve a low dopant concentration in the channel region and higher dopant concentration at the edge of the gate-bulk depletion region. Ideally, this would be a step junction. However, limitations in ion implantations and thermal anneal cycles (late in the fabrication process) tend to smear out step junctions. This problem can be partially mitigated by performing a single anneal step after all implants—including well implants, buried electrode region implants, source and drain implants, etc.—have been performed. Further improvement can be achieved by selecting a buried electrode region dopant species which is relatively immobile (i.e., it has a relative low diffusion coefficient in a silicon substrate). Another approach is to grow a lightly doped silicon epitaxial layer on top of a heavily doped bulk substrate. The epitaxial depletion region can have a very abrupt junction and thereby come much closer to ideal step profile than can be produced by ion implantation.

It is known that CMOS devices operate differently at different temperatures. As a device is cooled, the charge carrier mobility in the channel region increases. The threshold voltage also increases. Most importantly, the performance of the transistor increases for a given threshold voltage due to the increased mobility of charge carriers and the reduced critical voltage of the device. This is generally true of long channel and short channel devices. Thus, at lower temperatures, most conventional devices can be expected to have improved performance.

Figure 6:
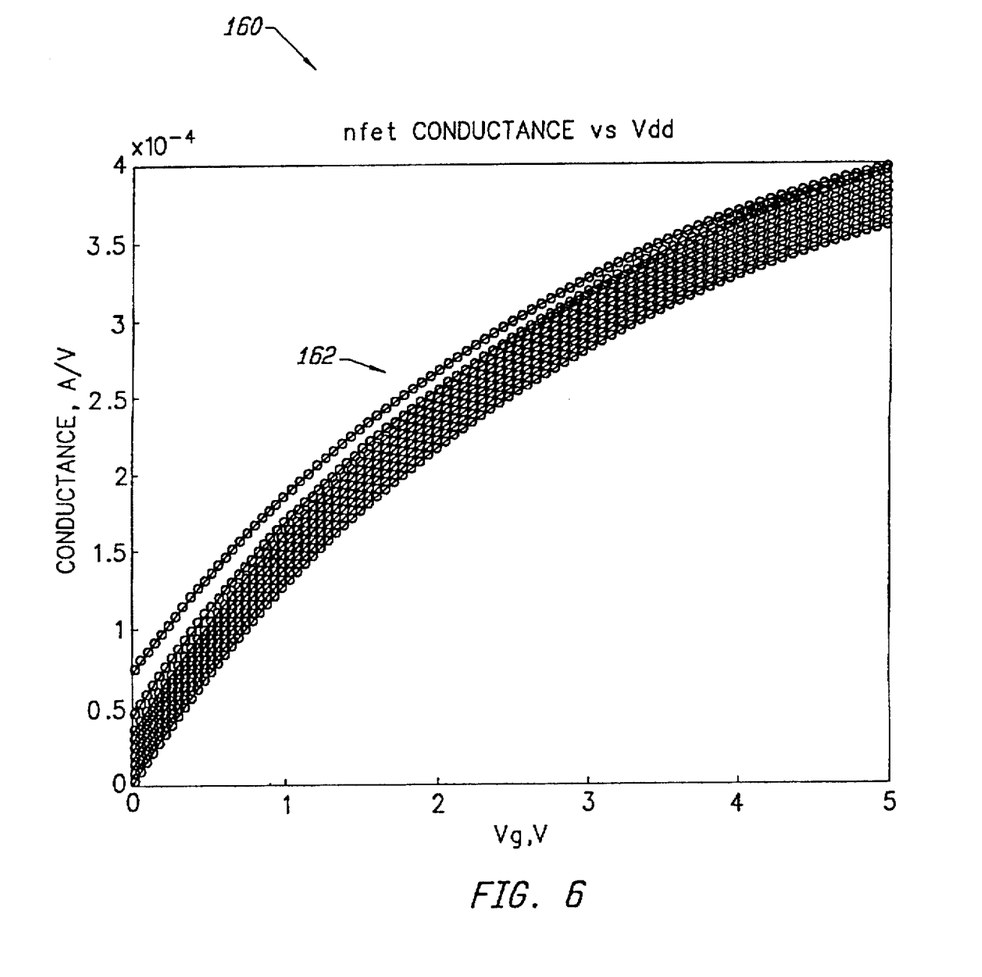
FIG. 6 is a graphical view of the performance of a low threshold transistor in room temperature conditions.

FIG. 6 shows a graph 160 of Ids/Vdd (conductance) vs. Vdd for a (long channel) low Vt transistor device operating at room temperature, which is about 300 K. The conductance scale is a rough equivalent of performance of the device as a function of supply voltage. The family of curves 162 represent differing amounts of back bias applied to the transistor, wherein the leftmost curve represents no back bias. The curves 162 tend to flatten out at higher supply voltages, indicating a degree of saturation in the device. This is a direct consequence of the reduced threshold voltage which results in higher mobility and thereby reduces saturation voltage.

Figure 7:
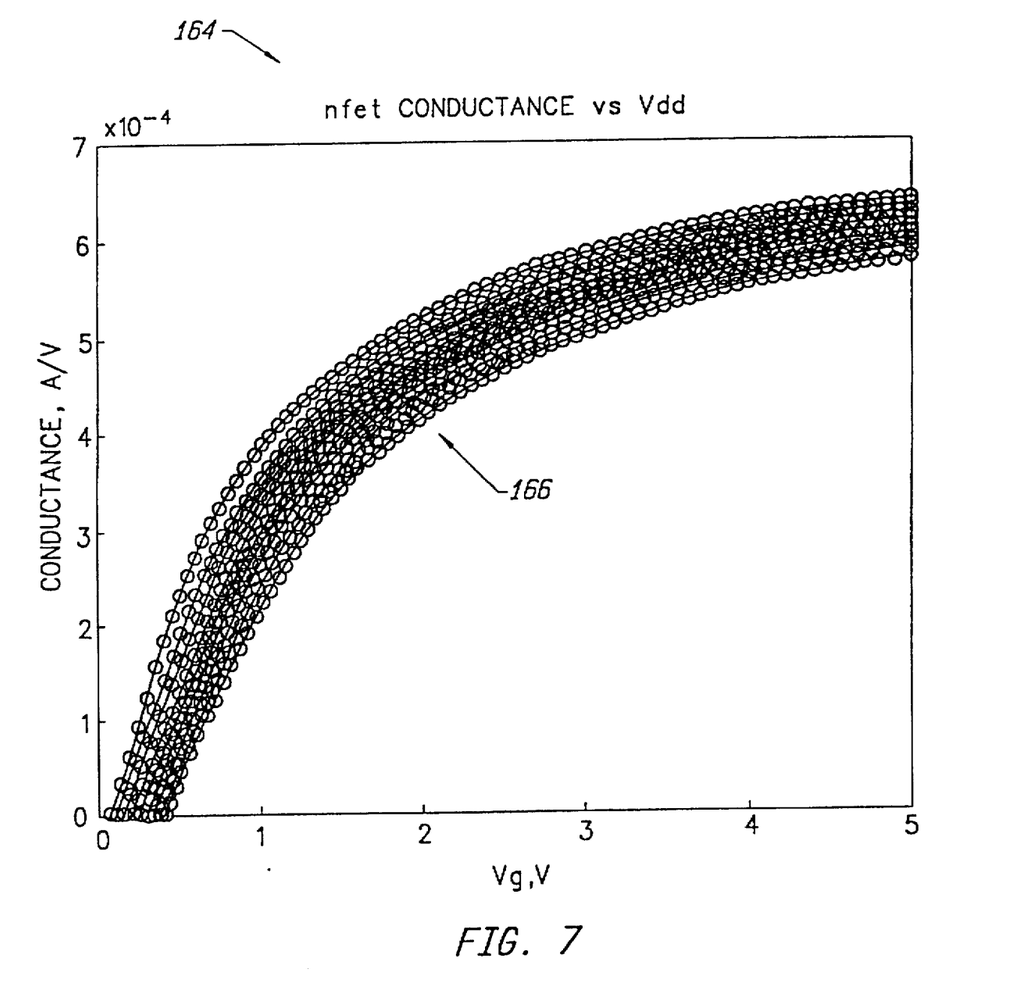
FIG. 7 is a graphical view of the performance of the FIG. 6 transistor at a temperature of 65 K.

FIG. 7 shows a graph 164 of the same (long channel) low-Vt transistor device of FIG. 6 operating at a lower temperature of 65 K. The family of curves 166 represent different amounts of back bias, similar to FIG. 6. The cooled transistor is much more saturated, indicating that an increased performance can be gained from the cooled device at lower supply voltages. The performance of the transistor does not improve significantly over 1 volt of supply voltage, thus emphasizing that lower supply voltages can be used without loss in performance.

As a device is cooled, the charge carrier mobility in the channel region increases. The threshold voltage also increases. Most importantly, the performance (frequency) of the transistor increases for a given threshold voltage due to the increased mobility of charge carriers and reduced critical voltage of the device. Thus, at lower temperatures, even greater performance can be achieved with the transistor device of the present invention. This is generally true of long channel and short channel transistor devices. In fact, even greater saturation can be obtained in short channel transistor devices than in the long channel device of FIG. 6. To the first order, the saturation voltage is proportional to the effective channel length ($l_{eff}$), so that if $l_{eff}$ is cut in half, Vdd can be cut in half. FIG. 7 shows no improvement in performance above 2 volts and left equal to 1.2 μm. In a modern device, left is about 0.3 μm, so it is expected that little improvement in performance will be realized above a Vdd of 500 mV, provided, of course, that the threshold voltage is reduced along with the supply. On the other hand, if Vt is 0.5 volts, then Vdd must be greater than 2.5 volts to approach maximum performance. This is why low thresholds are so important to low voltage performance in short channel devices.

To take advantage of performance improvements at lower temperatures, the doping levels of devices may have to be modified. For example, for devices having a threshold voltage of zero millivolts at the temperature of liquid nitrogen temperature (77 K), the doping levels should be set so that the threshold voltage would be about −200 mV at 300 K. This is because a device's current versus gate voltage curves shift with temperature. Of course, it may be possible to provide the device with sufficient tunability to operate over the entire temperature range. However, this extra tunability may compromise performance in some devices. When this is the case, devices will need to be optimized over a relatively narrow specified temperature range.

To implement low temperature CMOS transistors of the present invention, a cooling environment must be provided.

Preferred cooling systems operate at 0° C., −55° C., and −150° C., with performance improving but cost increasing with each lower temperature. At each of the listed temperatures, adequate cooling can be provided by a small refrigerator. Below −150° C., refrigeration costs become significantly higher, and carrier freeze out effects may create instabilities that are difficult to control.

It should be noted that in many short channel MOSFET devices, a large horizontal electric field associated with a relatively high Vdd can cause hot electron degradation, in which electrons penetrate the oxide layer above the bulk region or the drain region. This problem is typically solved using lightly doped drain (LDD) implants which provide a relatively low concentration of dopants in the tip regions 36A and 38A of source and drain regions 36 and 38. In the present invention, however, LDD's are typically not necessary, since the problem of hot electrons becomes negligible at supply voltages below about 1.5 volts.

Although certain preferred embodiments of the present invention have been described, it should be understood that the present invention may be embodied in many other specific forms without departing from the spirit or scope of the invention. Particularly, the NFETs illustrated above can be replaced with PFETs and the buried regions may find some usefulness in large channel devices. Therefore, the present examples are to be considered as illustrative and not restrictive, and the invention is not to be limited to the details given herein, but may be modified within the scope of the appended claims.

What is claimed is:

1. A MOS device on a semiconductor substrate which has an upper surface, the MOS device comprising:

a bulk region in said semiconductor substrate extending downward from said upper surface and having an average concentration of dopant of a first conductivity type;

source and drain regions of a second conductivity type extending from the semiconductor substrate surface into said bulk region by a predefined distance;

a channel region of the first conductivity type located between the source and drain regions;

a buried electrode region of the first conductivity type within the bulk region having an upper boundary located at or above the predefined distance, said buried electrode region having a dopant concentration that is greater than the average dopant concentration in the bulk region; and a gate positioned over the channel region, wherein the MOS device has a gate threshold voltage of between about ±150 mV, and wherein the buried electrode dopant concentration is at least about 10 times greater than an average dopant concentration in the bulk region, whereby the likelihood of punch through is diminished.

2. The MOS device of claim 1 wherein the concentration of the first conductivity type dopant in the channel region is at most about $1 \times 10^{16}$ atoms/cm$^3$.

3. The MOS device of claim 2 wherein the concentration of the first conductivity type dopant in the channel region is between about $1 \times 10^{14}$ and $1 \times 10^{16}$ atoms/cm$^3$.

4. The MOS device of claim 2 further comprising a counterdopant of the second conductivity type in the channel region.

5. The MOS device of claim 1 wherein the device has a tunable gate threshold voltage.

6. The MOS device of claim 5 wherein the gate threshold voltage is tunable by back biasing.

7. The MOS device of claim 5 further comprising a floating gate capable of tuning the device's threshold voltage.

8. The MOS device of claim 1 wherein the dopant concentration in the buried electrode is at least about $1 \times 10^{16}$ atoms/cm$^3$.

9. The MOS device of claim 8 wherein the dopant concentration in the buried electrode is between about $1 \times 10^{16}$ and $1 \times 10^{18}$ atoms/cm$^3$.

10. The MOS device of claim 1 wherein the buried electrode has side boundaries which abut the facing edges of the source and drain regions.

11. The MOS device of claim 1, wherein the dopant concentration in the buried electrode is between about 10 and 100 times greater than the average dopant concentration in the bulk region.

12. A MOS device on a semiconductor substrate which has an upper surface, the MOS device comprising:

a retrograde well region in said semiconductor substrate extending downward from said upper surface and having a graded concentration of dopant of the first conductivity type such that the dopant concentration is greater near the bottom of the well region;

source and drain regions of a second conductivity type which extend from the semiconductor substrate surface into the said retrograde well region;

a channel region of the first conductivity type located between the source and drain regions; and a gate positioned over the channel region, wherein the MOS device has a gate threshold voltage of between about ±150 mV, and wherein the dopant concentration proximate the bottom of the retrograde well is at least about 10 times greater than an average dopant concentration in the channel region, whereby the likelihood of punch through is diminished.

13. The MOS device of claim 12 wherein the concentration of the first conductivity type dopant in the channel region is at most about $1 \times 10^{16}$ atoms/cm$^3$.

14. The MOS device of claim 13 wherein the dopant concentration of the first conductivity type dopant in the channel region is between about $1 \times 10^{14}$ and $1 \times 10^{16}$ atoms/cm$^3$.

15. The MOS device of claim 13 further comprising a counterdopant of the second conductivity type in the channel region.

16. The MOS device of claim 12 wherein the device has a tunable gate threshold voltage.

17. The MOS device of claim 16 wherein the gate threshold voltage is tunable by back biasing.

18. The MOS device of claim 16 further comprising a floating gate capable of tuning the device's threshold voltage.

19. The MOS device of claim 12 wherein the local dopant concentration proximate the bottom of the retrograde well region is at least about $1 \times 10^{16}$ atoms/cm$^3$.

20. The MOS device of claim 19 wherein the local dopant concentration proximate the bottom of the retrograde well region is between about $1 \times 10^{16}$ and $1 \times 10^{18}$ atoms/cm$^3$.

21. The MOS device of claim 12 wherein the dopant concentration proximate the bottom of the retrograde well is between about 10 and 100 times greater than a dopant concentration in the channel region.

22. The MOS device of claim 12 wherein said source and drain regions include (a) source and drain plug regions extending from the semiconductor substrate surface into said retrograde well region by a first predefined distance; and (b) source and drain tip regions extending toward one another along the semiconductor substrate surface from facing edges of the source and drain plug regions, the tip regions extending into said retrograde well region by a second predefined distance which is less than the first predefined distance.

23. A MOS device on a semiconductor substrate which has an upper surface, the MOS device comprising:

- a bulk region in said semiconductor substrate extending downward from said upper surface and having an average concentration of dopant of a first conductivity type;
- source and drain regions of a second conductivity type extending from the semiconductor substrate surface into said bulk region by a predefined distance;
- a channel region of the first conductivity type located between the source and drain regions;
- a buried electrode region of the first conductivity type within the bulk region having an upper boundary disposed above the predefined distance, said buried electrode having a dopant concentration that is greater than the average dopant concentration in the bulk region; and
- a gate positioned over the channel region, wherein the MOS device has a gate threshold voltage of between about ±150 mV, and wherein the buried electrode dopant concentration is at least about 10 times greater than an average dopant concentration in the bulk region, whereby the likelihood of punch through is diminished and thereby allowing the MOS device to be tuned such that an applied back bias of 1 volt will shift the device's threshold voltage by between about 50 and 300 millivolts.

24. The MOS device of claim 23 whereto the buried electrode dopant concentration is sufficiently high to allow the MOS device to be tuned such that an applied back bias of 1 volt will shift the device's threshold voltage by between about 75 and 200 millivolts.

25. The MOS device of claim 24 wherein the buried electrode region dopant concentration is sufficiently high to allow the MOS device to be tuned such that an applied back bias of 1 volt will shift the device's threshold voltage by about 100 millivolts.

26. The MOS device of claim 23 wherein the dopant concentration of the first conductivity type in the channel region is at most about $1 \times 10^{16}$ atoms/cm$^3$.

27. The MOS device of claim 23 wherein the dopant concentration in the buried electrode is between about 10 and 100 times greater than an average dopant concentration in the bulk region.

* * * * *

UNITED STATES PATENT AND TRADEMARK OFFICE
CERTIFICATE OF CORRECTION

PATENT NO. : 5,719,422
DATED : February 17, 1998
INVENTOR(S) : Burr *et al.*

It is certified that error appears in the above-identified patent and that said Letters Patent is hereby corrected as shown below:

Claim 1, line 42, please delete the word "region".

Claim 1, line 45, please delete the word "region".

Claim 21, line 59, please add a --,-- after the number "12".

Claim 23, line 19, please delete the word "region".

Claim 24, line 8, please replace the word "whereto" with the word --wherein--.

Claim 25, line 15, please delete the word "region".

Signed and Sealed this

Twenty-second Day of December, 1998

*Attest:*

BRUCE LEHMAN

*Attesting Officer*  Commissioner of Patents and Trademarks